United States Patent [19]

Rumps

[11] Patent Number: 5,240,090
[45] Date of Patent: Aug. 31, 1993

[54] APPARATUS AND METHOD OF LUBRICATING COMPONENT LEADS

[75] Inventor: Donald W. Rumps, Oklahoma City, Okla.

[73] Assignee: AT&T Bell Laboratories, Murray Hill, N.J.

[21] Appl. No.: 991,036

[22] Filed: Dec. 15, 1992

[51] Int. Cl.⁵ .............................. F01M 5/00
[52] U.S. Cl. ................... 184/6.22; 184/6.21; 184/109; 34/12
[58] Field of Search ............ 184/6.21, 6.22, 104.1, 184/109; 34/45, 12; 261/95, 99

[56] References Cited

U.S. PATENT DOCUMENTS 3,996,114  12/1976  Ehrsam .
4,043,878  8/1977   Ehrsam .
4,074,922  2/1978   Murdoch .
4,094,749  6/1978   Stange et al. .
4,971,564  11/1990  Meyer .

Primary Examiner—Thomas E. Denion
Attorney, Agent, or Firm—Dwight A. Marshall

[57] ABSTRACT

Apparatus and method of lubricating leads for installation of a component on a circuit board. In the process, a strip of conductive foam is compressed and inserted into a solution of solvent and lubricant operation. The compressed form is permitted to expand within the solution thereby resulting in the foam being saturated with the solution. The saturated foam is air dried to remove the solution and produce a foam that is impregnated with the lubricant. The leads of the component are inserted into the impregnated foam thereby resulting in each component lead being covered with a thin coat of the lubricant.

10 Claims, 1 Drawing Sheet

APPARATUS AND METHOD OF LUBRICATING COMPONENT LEADS

FIELD OF INVENTION

The invention relates to apparatus and method for lubricating leads and in particular to applying lubrication to component electrical male leads.

BACKGROUND AND PROBLEM

In the manufacture of electrical and electronic equipment integrated circuit (IC) components are mounted onto circuit boards that are in turn inserted into equipment frames. The circuit boards are interconnected by backplane apparatus located in the equipment frames to form electrical and electronic equipment such as telephone and computer equipment.

Typically, an IC component has a body of a generally rectangular configuration with electrical male leads formed over at right angles to extend below a bottom surface of the body. Sockets for receiving IC components are located on the circuit boards with each socket having a number of female contacts positioned within the socket to each correspond with a male lead of an IC component. In the manufacture of circuit boards, and IC component is positioned with respect to a circuit board socket with each male lead of the component aligned with a corresponding female contact of the socket. The IC component is installed on the circuit board by inserting each component male lead in a corresponding female contact of the socket.

During the installation process, friction generated by inserting the component male leads into the socket female contacts often results in damage occurring to both component leads and socket contacts. The friction can be reduced by applying a thin layer of lubrication to the component male leads. A problem arises in applying lubricant to the component leads. In some instances, the lubrication may be sprayed or painted on the component leads. Each of these processes are labor intensive and are difficult to implement in manufacturing applications. Accordingly, a need exists for apparatus and method that may be automated to apply a lubricant to component leads.

SOLUTION

The foregoing problem is solved by apparatus and a method that may be automated to apply a coating of lubricant to leads of a component. The apparatus and method compresses a strip of conductive foam and discharges the compressed foam in a solution of one part of a standard lubricant combined with four parts of a solvent such as n-butyl butyrate. The compressed foam expands in the solution to saturate the foam with the solvent and lubricant solution. The saturated foam is dryed to remove the solvent thereby leaving the foam impregnated with the lubricant. The leads of the component are inserted into the impregnated foam to coat each component lead with a thin coating of lubricant.

DETAILED DESCRIPTION

Figure 1:
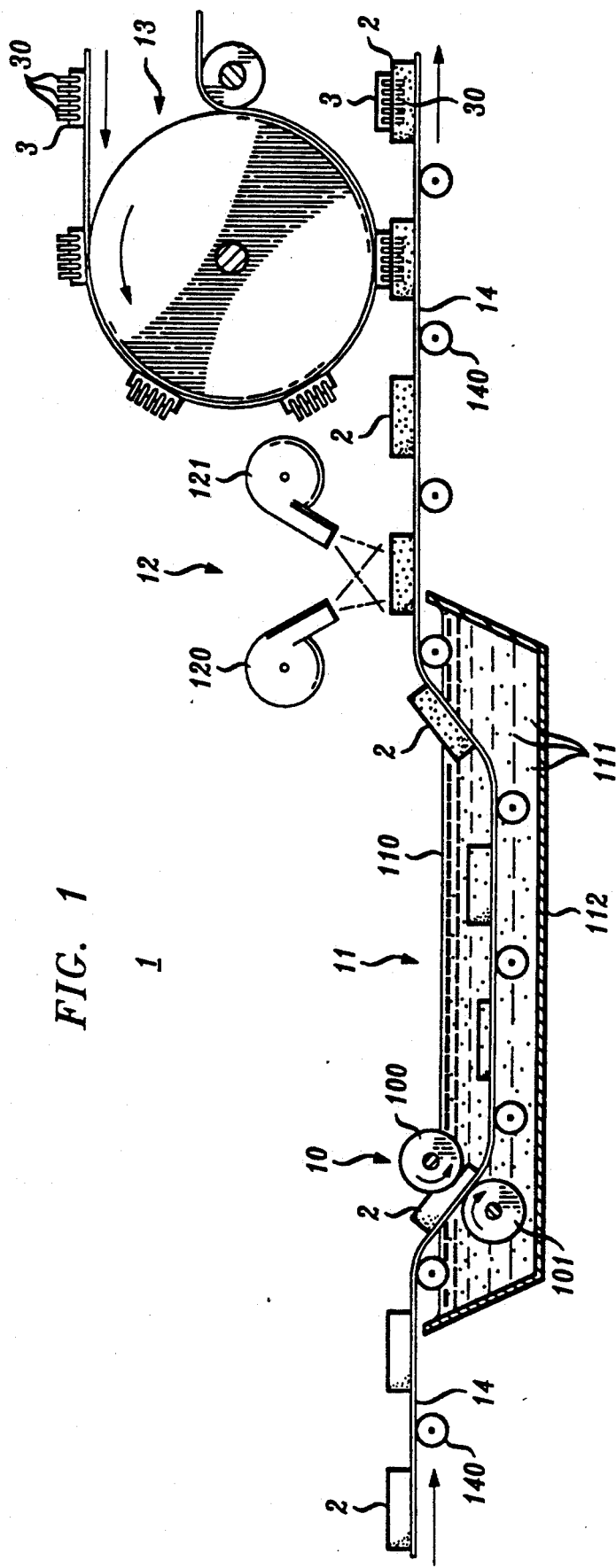
FIG. 1 illustrates apparatus and method of applying lubricant to leads of components in accordance with the principles of the invention.

In an exemplary embodiment of the invention as set forth in FIG. 1, apparatus 1 is intended for use in applying a lubricant to a lead such as an electrical conducting male lead 30 of an IC component 3. Apparatus 1 may comprise a moving assembly line 14 positioned to roller devices 140 enabling a work piece to move between various workstations positioned along the line. The assembly line apparatus comprises a strip of foam 2 and expands foam 2 in a solution 11 consisting of solvent 110 and lubricant 111 into a foam 2 saturated with solvent 110 and lubricant 111. Apparatus 1 dries saturated foam 2 to remove solvent 110 leaving foam 2 impregnated with lubricant 111. IC component 3 is positioned to insert lead 30 into impregnated foam 2 to apply lubricant 111 to a portion of component lead 30.

Stations located along assembly line 14 include a container 112 having a bath therein comprising a solution 11 of a solvent 110 and lubricant 111. Typically, solution 11 may, although not limited thereto, consist of one part of a standard lubricant normally used to lubricate electrical leads combined with four parts of a standard solvent such as n-butyl butyrate or 1,1,1-trichlorethane. The resulting solution 11 may be in the form of an emulsion with solvent 110 dispersed with lubricant 111 or may have lubricant 111 dissolved within solvent 110.

Another assembly line workstation includes a roller assembly 10 which may be either a single roller or pair of opposing rollers 110, 101. Roller assembly 10 may be mounted on assembly line 14 or within solution container 112 and functions to receive and compress foam 10. The compressed foam 2 is discharged into solution 11 and expands to absorb the solution and reach a saturated state. A dryer assemble 12 is coupled with container 112 to receive the expanded saturated foam 2. Dryers 120 and 121 function to dry the received saturated foam 2 to remove solvent 110 from foam 2 leaving foam 2 impregnated with lubricant 111.

Assembly line 14 further includes a component workstation 13 arranged to receive and hold a number of IC components 3. Component workstation 13 is coupled with dryer assembly 12 and receives lubricant impregnated foam 2. Workstation 13 operates to insert male leads 30 of each IC component 3 into impregnated foam 2 to coat a portion of male lead 30 with a thin layer of lubricant 111.

In operation, a strip of electrical conductive foam 2 moves along assembly line 2 and is compressed by roller assembly 14. Opposing rollers 100, 101, or other type of compressing elements, press foam 2 into a compressed form which is then discharged into solvent and lubricant solution 11. Foam 2 expands and absorbs solution 11 to reach a saturated state. The expanded and saturated foam 2 is received by drying apparatus 12. Air blowers 120, 121 directs air against saturated foam 2 to dry saturated foam 2 and remove solvent 110 leaving foam 2 impregnated with lubricant 111.

Workstation 13, having a plurality of IC components 3 positioned thereon, receives dried lubricant impregnated foam 2 and inserts each component electrical male lead 30 into impregnated foam 2 to coat a portion of lead 30 with a thin layer of lubricant 111.

Although the illustrious embodiment of the invention illustrates a strip of electrical conductive foam 2, it is to be understood that a continuous strip of foam 2 could be used within the teaching of the invention.

I claim:

1. Apparatus for lubricating a lead comprising means for compressing a strip of foam and expanding the foam in a solution of solvent and lubricant to saturate the foam with the solvent and lubricant, and means for drying the saturated foam to remove the solvent leaving the foam impregnated with the lubricant and for inserting the lead into the impregnated foam to apply the lubricant to the lead.

2. The lubricating apparatus set forth in claim 1 wherein said compressing and expanding means comprises container means for holding the solvent and lubricant solution and having a pair of opposing rollers mounted therein for receiving and compressing the foam and for discharging the compressed foam into the solution to enable the compressed foam to expand to absorb the solution.

3. The lubricating apparatus set forth in claim 2 wherein said drying and inserting means comprises means coupled with said container means for receiving the expanded saturated foam and for drying the saturated foam to remove the solvent from the saturated foam and leaving the foam impregnated with the lubricant.

4. The lubricating apparatus set forth in claim 3 wherein said drying and inserting means comprises means coupled with said receiving and drying means for receiving the lubricant impregnated foam and for inserting the lead therein to coat a portion of the lead with a thin layer of the lubricant.

5. Apparatus for lubricating IC component male electrical leads comprising a container holding a solution of a solvent combined with a lubricant and having a pair of opposing rollers mounted therein for receiving and compressing an electrical conducting foam and for discharging the compressed foam into the solution to enable the compressed foam to expand and absorb the solution, drying means coupled with said container for receiving the expanded foam from the container and for drying the foam to remove the solvent leaving the foam impregnated with the lubricant, and component insertion means holding a plurality of IC components and coupled with the drying means for receiving the lubricant impregnated foam and for inserting male electrical leads of each component into the impregnated foam to coat a portion of each lead with a thin layer of the lubricant.

6. A method of lubricating a lead comprising the steps of compressing a strip of foam and expanding the compressed foam in a solution of solvent and lubricant to saturate the foam with the solution, and drying the saturated foam to remove the solvent leaving the foam impregnated with the lubricant and inserting the lead into the impregnated foam to coat the lead with a thin coating of lubricant.

7. The lubricating method set forth in claim 6 wherein said compressing and expanding step comprises the steps of pressing the foam between a pair of rollers and discharging the compressed foam into a container holding the solvent and lubricant solution to expand and absorb the solution to reach a saturated state.

8. The lubricating method set forth in claim 7 wherein said drying and inserting step comprises the step of receiving the expanded saturated foam from the container and drying the saturated foam to remove the solvent from the foam leaving the foam impregnated with the lubricant.

9. The lubricating method set forth in claim 8 wherein said drying and inserting step comprises the step of receiving the dried lubricant impregnated foam and inserting the lead therein to coat a portion of the lead with a thin layer of the lubricant.

10. A method of lubricating IC component male electrical leads comprising the steps of pressing a strip of electrical conducting foam between a pair of rollers and discharging the compressed foam into a solution of solvent and lubricant to expand and absorb the solution to reach a saturated state, receiving the expanded saturated foam from the solution and drying the saturated foam to remove the solvent from the foam leaving the foam impregnated with the lubricant, and inserting electrical leads of ones of a plurality of IC components into the impregnated foam to coat a portion of the lead with a thin layer of the lubricant.

* * * * *